US012619084B2

(12) United States Patent
Boger et al.

(10) Patent No.: US 12,619,084 B2
(45) Date of Patent: May 5, 2026

(54) HEAD-MOUNTED DISPLAY FOR PUBLIC USE

(71) Applicant: Razer (Asia-Pacific) Pte. Ltd., Singapore (SG)

(72) Inventors: Yuval S. Boger, Baltimore, MD (US); Yaron Kaufman, Olney, MD (US)

(73) Assignee: RAZER (ASIA-PACIFIC) PTE. LTD., Singapore (SG)

( * ) Notice: Subject to any disclaimer, the term of this patent is extended or adjusted under 35 U.S.C. 154(b) by 490 days.

(21) Appl. No.: 18/204,162

(22) Filed: May 31, 2023

(65) Prior Publication Data

US 2023/0305309 A1     Sep. 28, 2023

Related U.S. Application Data

(63) Continuation of application No. 16/334,349, filed as application No. PCT/US2017/052272 on Sep. 19, 2017, now Pat. No. 11,686,946.

(Continued)

(51) Int. Cl.
*G02B 27/00*     (2006.01)
*G02B 27/01*     (2006.01)
*H05K 7/20*     (2006.01)

(52) U.S. Cl.
CPC ..... *G02B 27/0176* (2013.01); *H05K 7/20954* (2013.01); *G02B 2027/0156* (2013.01); *G02B 2027/0178* (2013.01)

(58) Field of Classification Search
CPC ............... G02B 27/01; G02B 27/0101; G02B 27/0103; G02B 27/0149; G02B 27/017; G02B 27/0172; G02B 27/0176; G02B 27/0179; G02B 27/0189; G02B 2027/0105; G02B 2027/0107; G02B 2027/0109; G02B 2027/011; G02B 2027/0112;

(Continued)

(56) References Cited

U.S. PATENT DOCUMENTS 5,392,158 A       2/1995   Tosaki
6,480,174 B1 *   11/2002  Kaufmann ......... G02B 27/0172
                                                          359/13

(Continued)

FOREIGN PATENT DOCUMENTS

WO          2011/159757 A1    12/2011

OTHER PUBLICATIONS

International Search Report and Written Opinion dated Jan. 8, 2018 for corresponding International Application No. PCT/US2017/052272 (9 pages).

*Primary Examiner* — Henry Duong
(74) *Attorney, Agent, or Firm* — Polsinelli PC

(57)          ABSTRACT

Some embodiments described herein relate to head-mounted displays having an optical assembly and a support structure. The optical assembly can include the display, lenses, sensors, electronics and similar components. In this way, fragile and/or expensive components can be concentrated in the optical assembly. The support structure can include a faceplate and straps configured to hold the head-mounted display to the user's head. The optical assembly can be removably coupled to the support structure. Support structures can be interchangeable with optical assemblies such that one support structure can be configured to be removably coupled to all, most, or several optical assemblies.

18 Claims, 14 Drawing Sheets

Related U.S. Application Data

(60) Provisional application No. 62/396,499, filed on Sep. 19, 2016.

(58) Field of Classification Search

CPC .... G02B 2027/0114; G02B 2027/0116; G02B 2027/0118; G02B 2027/012; G02B 2027/0121; G02B 2027/0123; G02B 2027/0156; G02B 2027/0178; G02B 2027/0152; G02B 2027/0125; G02B 2027/0127; G02B 2027/0129; G02B 2027/013; G02B 2027/0132; G02B 2027/0134; G02B 2027/0136; G02B 2027/0138; G02B 2027/014; G02B 2027/0141; G02B 2027/0143; G02B 2027/0145; G02B 2027/0147; G02B 2027/015; G02B 2027/0154; G02B 2027/0158; G02B 2027/0159; G02B 2027/0161; G02B 2027/0163; G02B 2027/0165; G02B 2027/0167; G02B 2027/0169; G02B 2027/0174; G02B 2027/0181; G02B 2027/0183; G02B 2027/0185; G02B 2027/0187; G02B 2027/019; G02B 2027/0192; G02B 2027/0194; G02B 2027/0196; G02B 2027/0198; H05K 7/20954; G06F 3/012; G06F 3/011

USPC .......................................... 359/630

See application file for complete search history.

(56) References Cited

U.S. PATENT DOCUMENTS

| 10,330,887 | B2 | 6/2019 | Bristol et al. | |
| 2011/0145978 | A1* | 6/2011 | Harbin | G02B 27/0176 |
| | | | | 2/209.13 |
| 2011/0241976 | A1 | 10/2011 | Boger et al. | |
| 2015/0103152 | A1* | 4/2015 | Qin | G02B 27/0176 |
| | | | | 348/53 |
| 2015/0138645 | A1* | 5/2015 | Yoo | G02B 27/0101 |
| | | | | 359/630 |
| 2015/0198811 | A1 | 7/2015 | Hoellwarth | |
| 2015/0234189 | A1* | 8/2015 | Lyons | G02B 27/017 |
| | | | | 345/174 |
| 2015/0238361 | A1* | 8/2015 | Mcculloch | A61F 9/029 |
| | | | | 2/435 |
| 2015/0253574 | A1* | 9/2015 | Thurber | G02B 27/0172 |
| | | | | 359/630 |
| 2016/0266412 | A1 | 9/2016 | Yoshida | |
| 2016/0377872 | A1* | 12/2016 | Hurbi | G02B 27/0176 |
| | | | | 359/630 |
| 2017/0153672 | A1 | 6/2017 | Shin et al. | |
| 2017/0352184 | A1* | 12/2017 | Poulos | G06F 3/011 |
| 2018/0003984 | A1 | 1/2018 | Lai et al. | |

* cited by examiner

200

200

210

250

HEAD-MOUNTED DISPLAY FOR PUBLIC USE

CROSS REFERENCE TO RELATED APPLICATION

This application is a Continuation of U.S. patent application Ser. No. 16/334,349 filed Mar. 18, 2019, which is a U.S. National Phase of International Application No. PCT/US2017/052272 filed Sep. 19, 2017, which claims the benefit of provisional U.S. Patent Application No. 62/396,499, filed Sep. 19, 2016, entitled "Head-Mounted Display for Public Use," the disclosure of which are hereby incorporated by reference in their entirety.

BACKGROUND

Some embodiments described herein relate to head-mounted displays. Some head-mounted displays described herein are particularly suited for public use. A head-mounted display can include an optical display that can be used for augmented- or virtual-reality applications.

Head-mounted displays frequently include relatively expensive optics, displays, and/or electronic components and are relatively fragile devices intended to be used over a relatively long period of time. Because head-mounted displays are typically placed into contact with a user's face and straps make contact with the user's hair, known head-mounted devices are also rather personal in nature. Similarly stated, head-mounted displays are typically single-owner devices that, for reasons related to hygiene, are not shared among strangers.

A different and emerging use case for head-mounted displays is in public attractions, such as theme parks, movie theaters, lecture halls, etc. In such a scenario, an attraction owner may provide head-mounted displays for guests. For hygiene reasons, operators of such attractions will typically clean the head-mounted display(s) between use. Given the complexity and fragility of known head-mounted display, such cleaning is time consuming and/or not very thorough. In addition, a head-mounted display is unavailable for guests while being cleaned, reducing guest throughput and/or requiring surplus head-mounted displays. Given the significant cost of known head-mounted displays, maintaining an inventory of surplus head-mounted displays and/or reducing throughput can have a significant impact on the cost of operating the public attraction.

A need therefore exists for head-mounted displays that address the needs of public-use scenarios.

DETAILED DESCRIPTION

Figure 1:
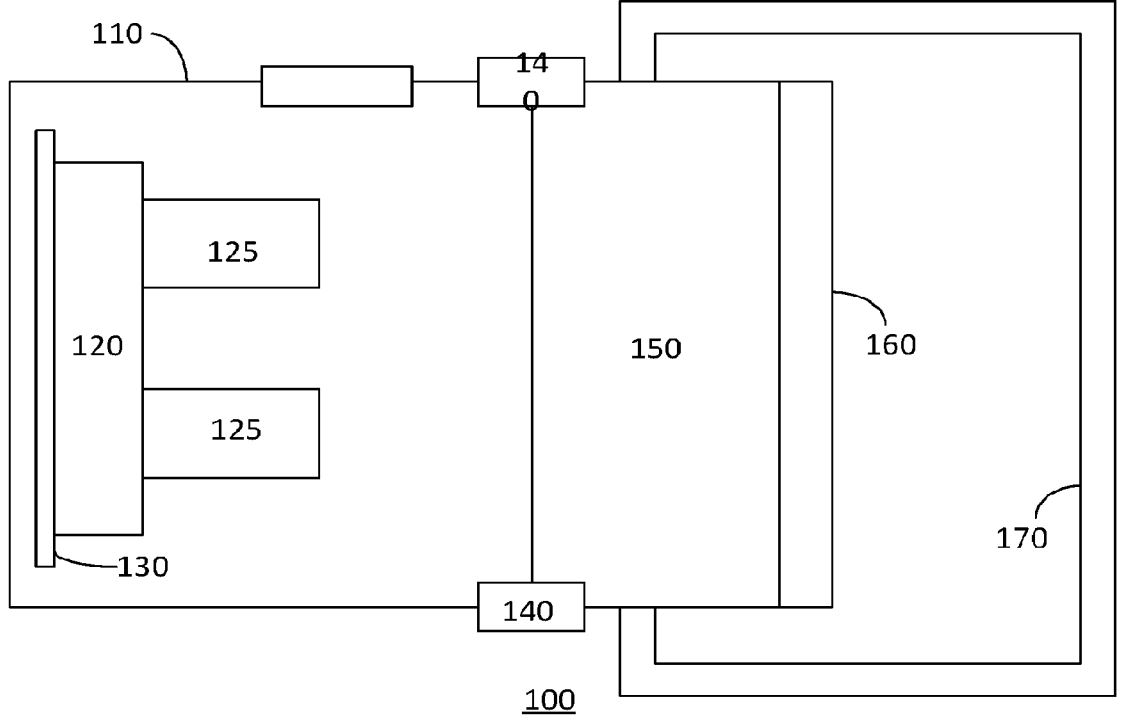
FIG. 1 is a schematic diagram of a head-mounted display, according to an embodiment.
Figure 2:
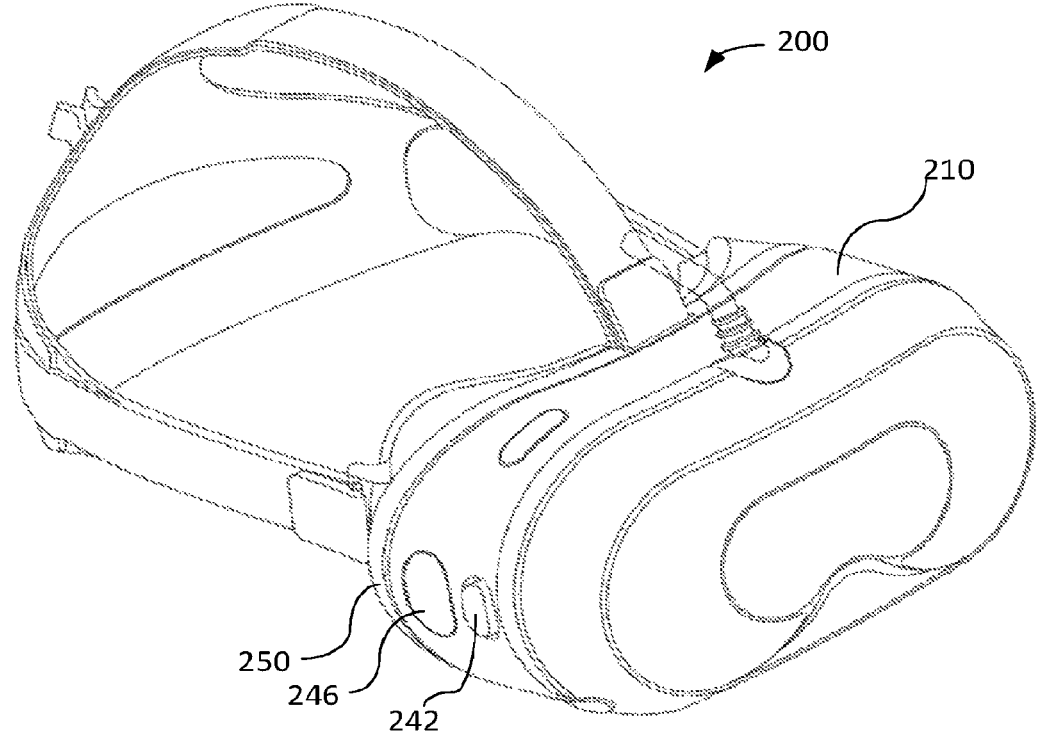
FIG. 2 is a front left perspective view of a head-mounted display, according to an embodiment.
Figure 3:
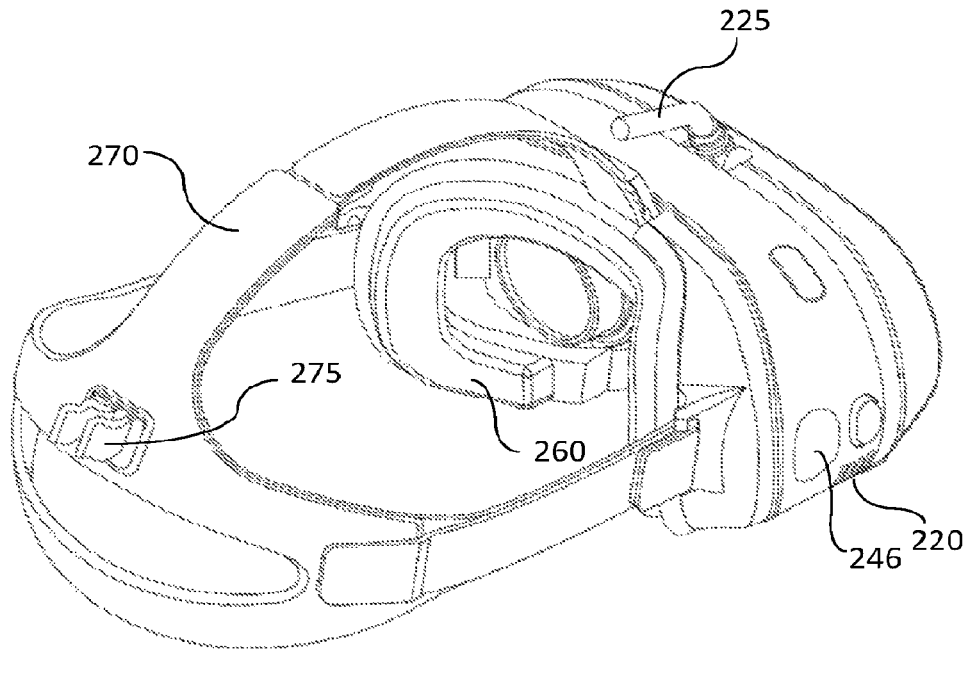
FIG. 3 is rear right perspective view of the head-mounted display of FIG. 2.
Figures 4, 5:
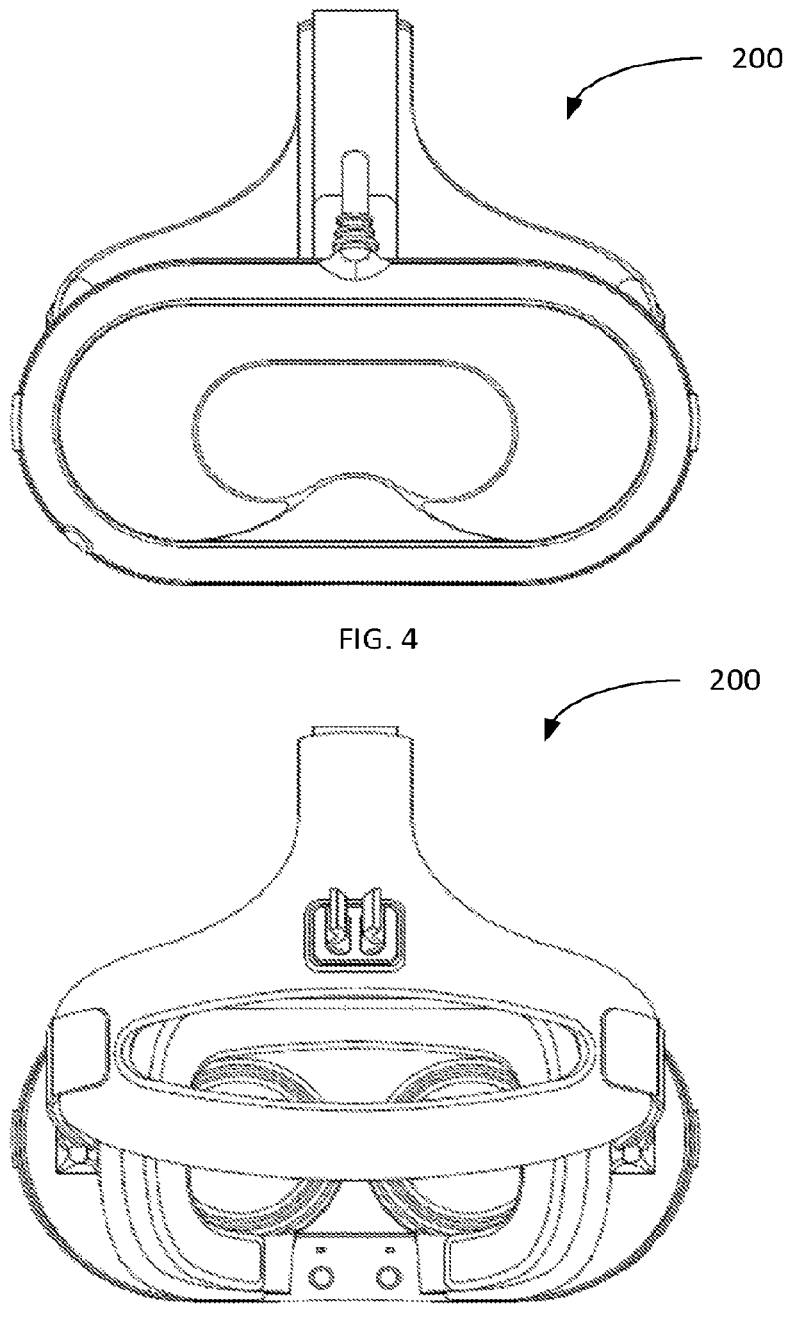
FIG. 4 is a front view of the head-mounted display of FIG. 2.
FIG. 5 is a rear view of the head-mounted display of FIG. 2.
Figure 6:
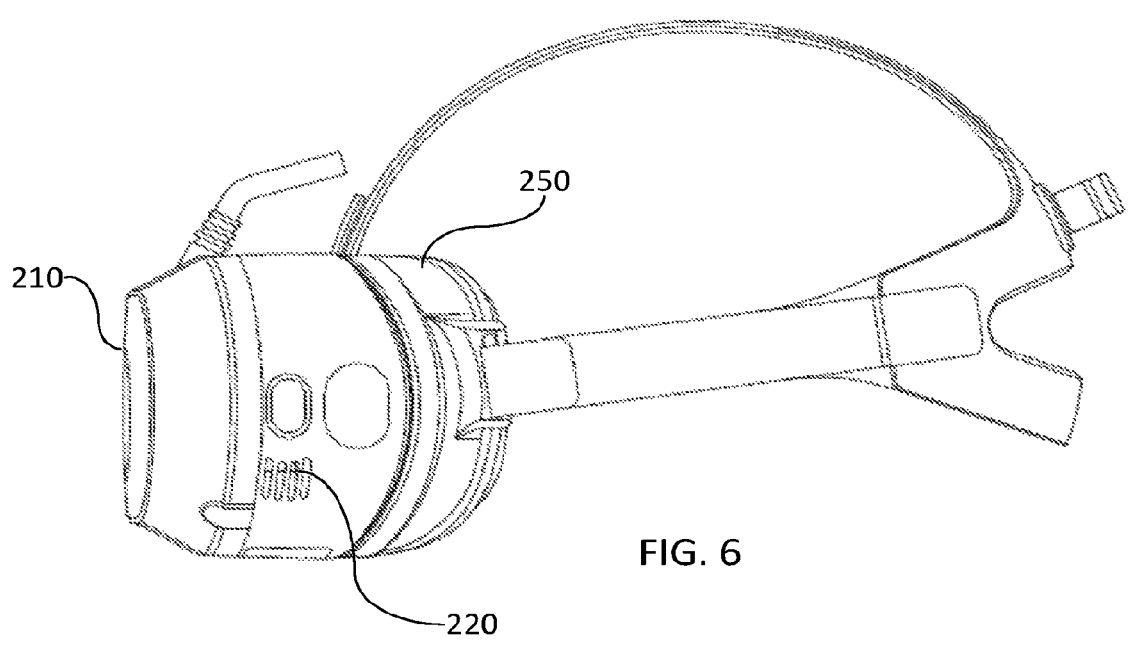
FIG. 6 is a left view of the head-mounted display of FIG. 2.
Figure 7:
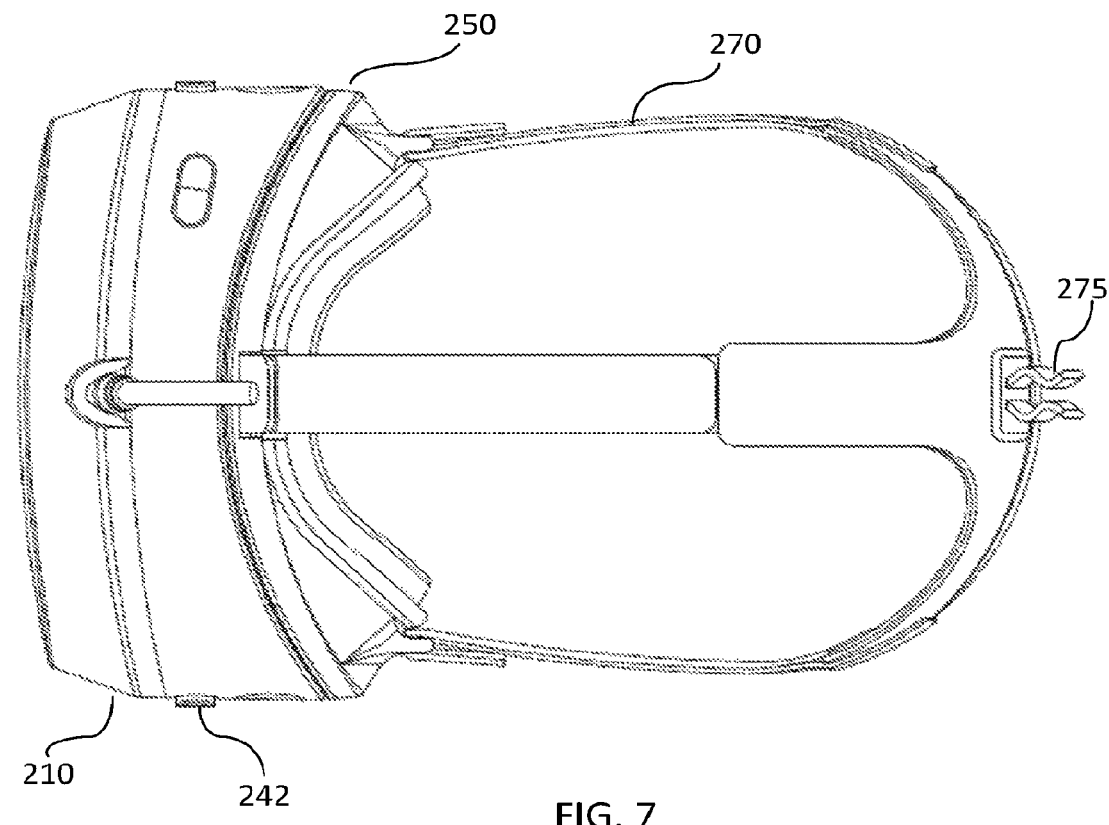
FIG. 7 is a top view of the head-mounted display of FIG. 2.
Figure 8:
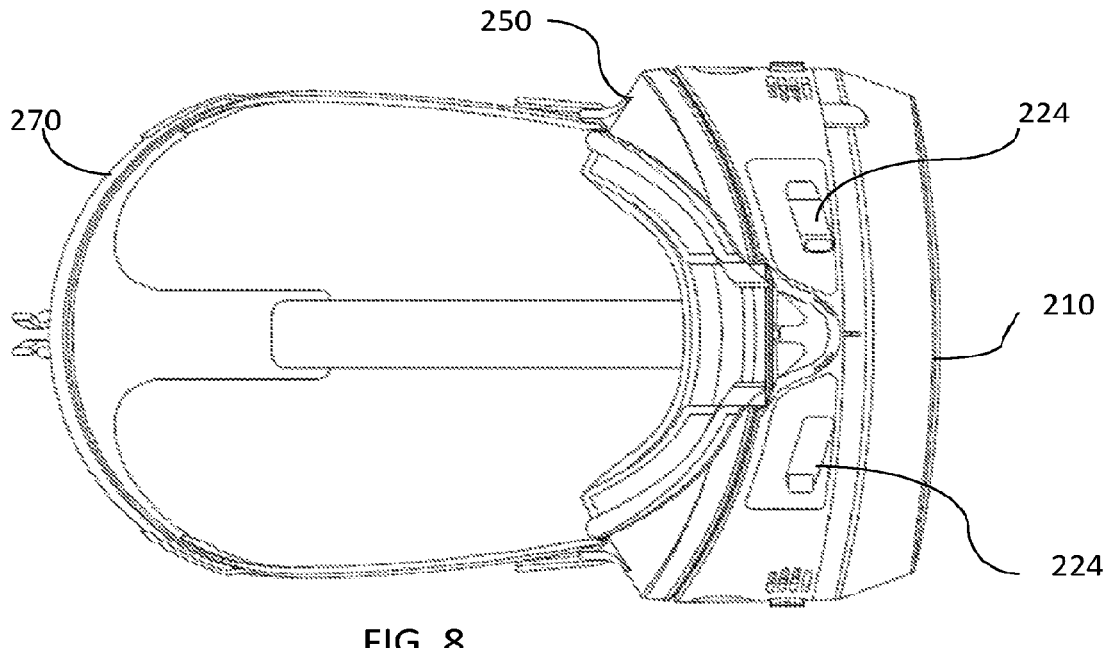
FIG. 8 is a bottom view of the head-mounted display of FIG. 2.
Figure 9:
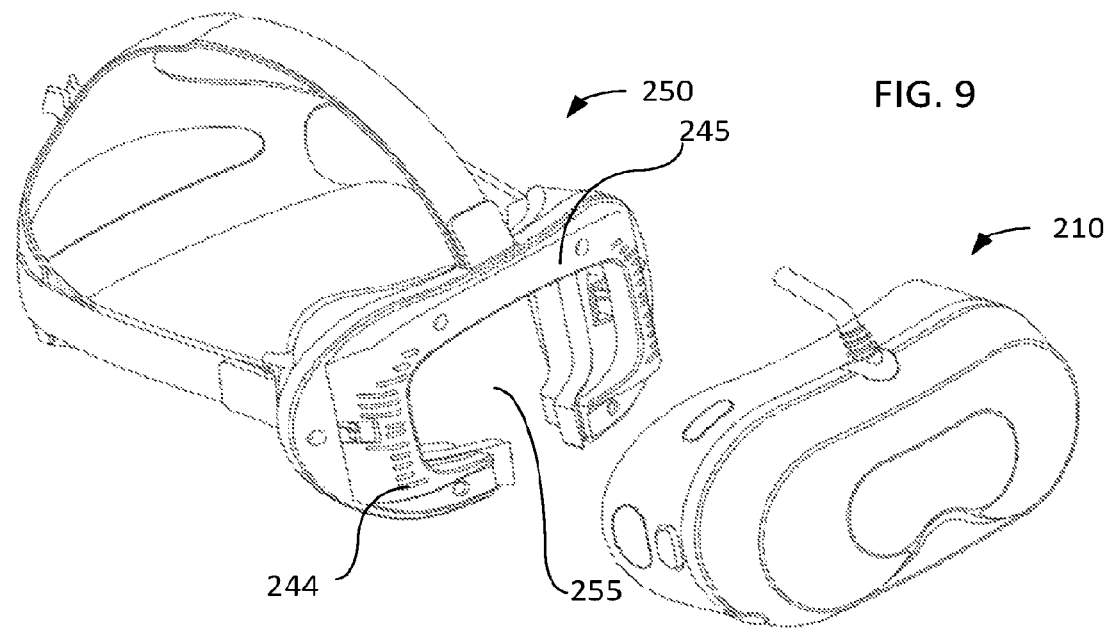
FIG. 9 is a front left perspective view of the head-mounted display of FIG. 2 showing an optical assembly decoupled from a support structure.
Figure 10:
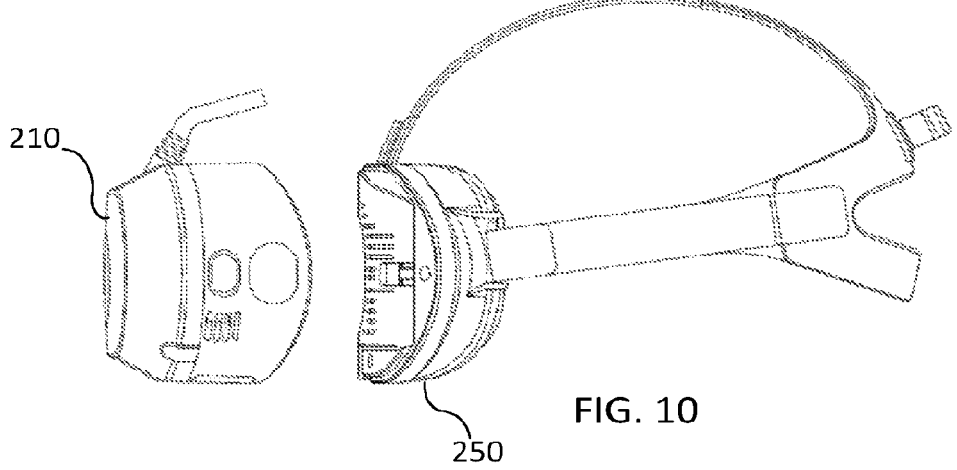
FIG. 10 is a right view of the head-mounted display of FIG. 2 showing an optical assembly decoupled from a support structure.
Figure 11:
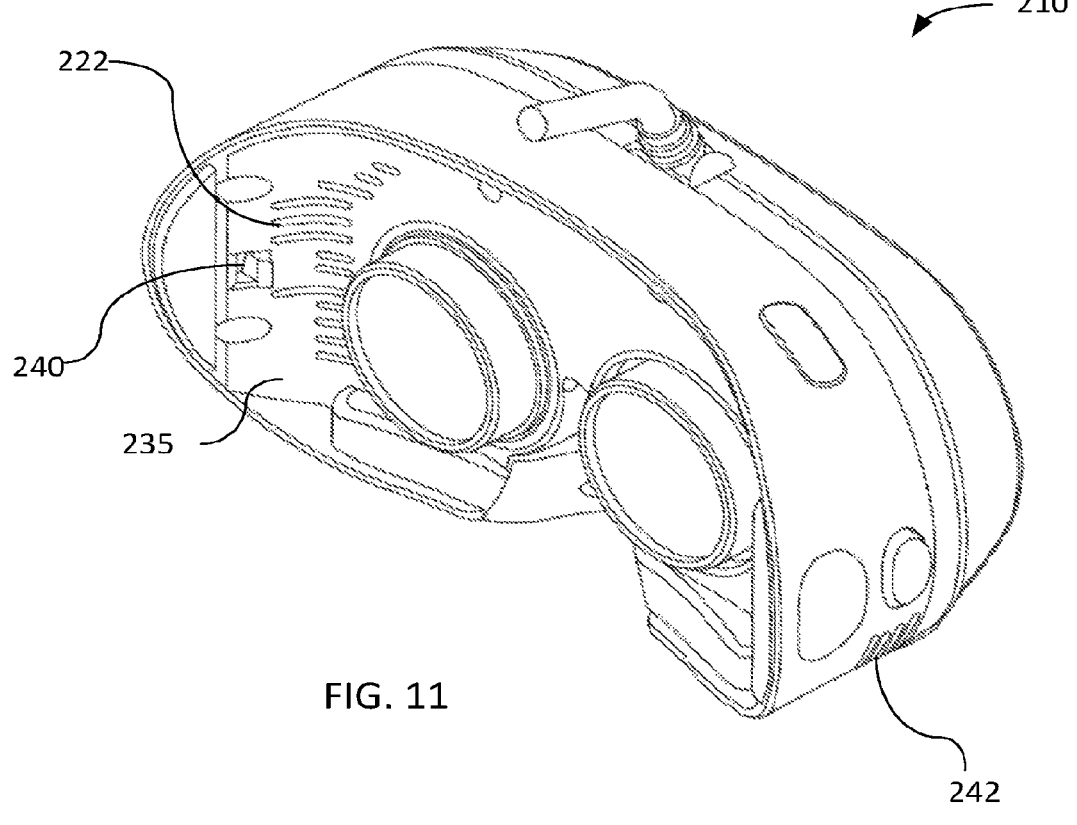
FIG. 11 is a rear left perspective view of the optical assembly of the head-mounted display of FIG. 2.
Figure 12:
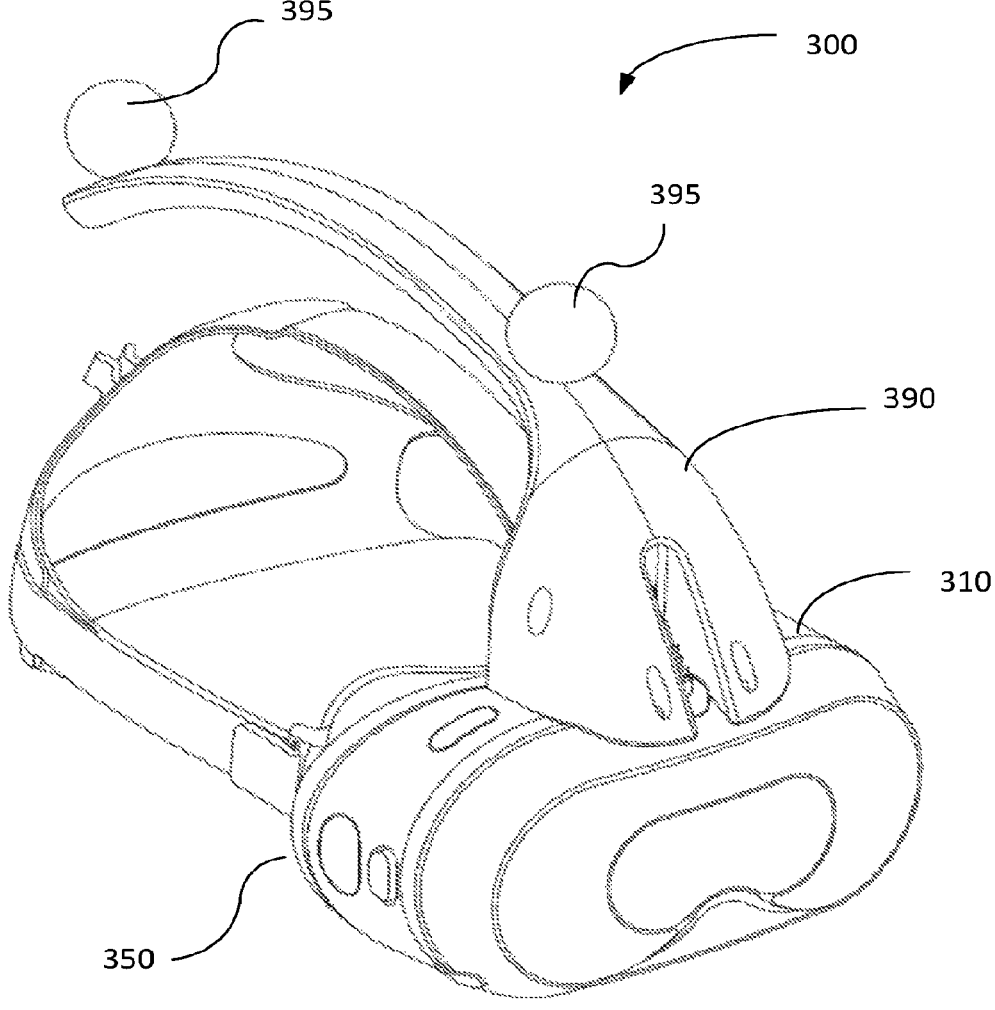
FIG. 12 is a front left view of a head-mounted display, according to an embodiment.
Figure 13:
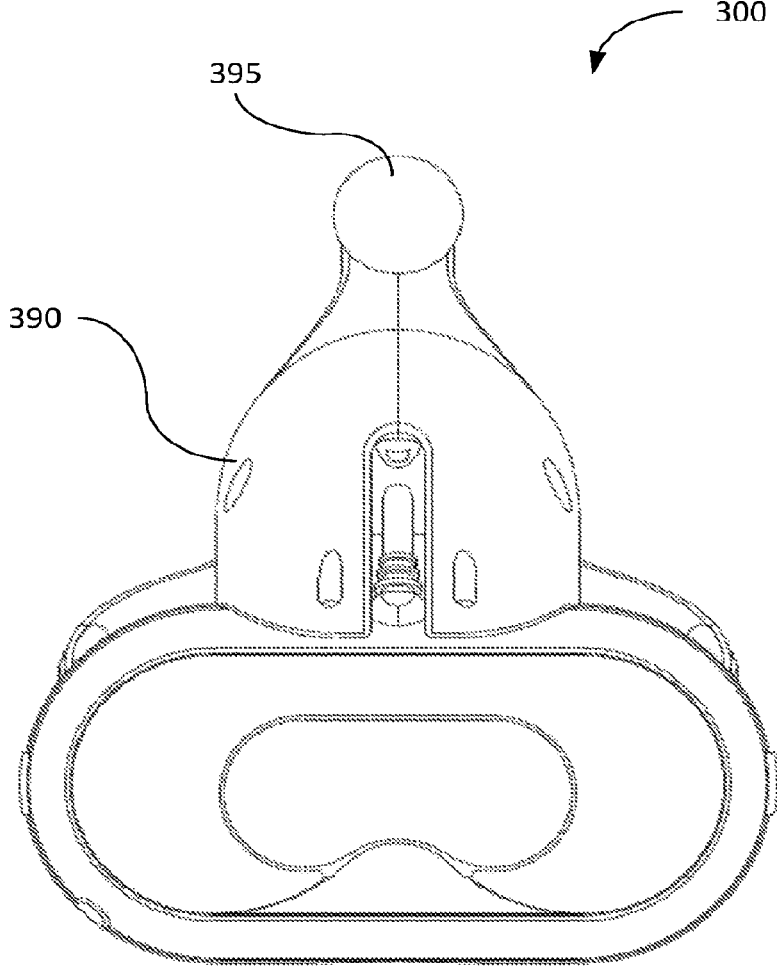
FIG. 13 is a front view of the head-mounted display of FIG. 12.
Figure 14:
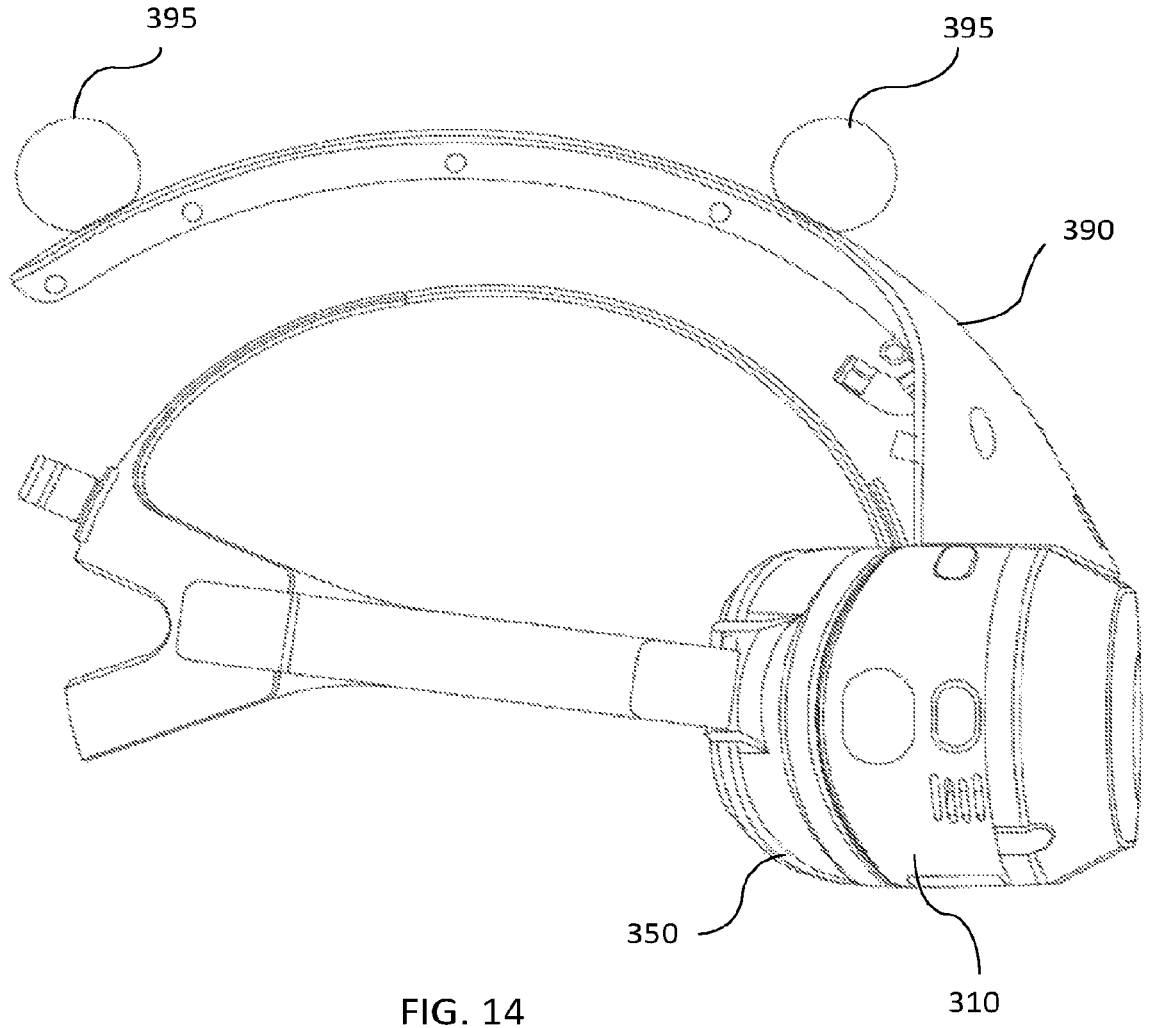
FIG. 14 is a left view of the head-mounted display of FIG. 12.
Figure 15:
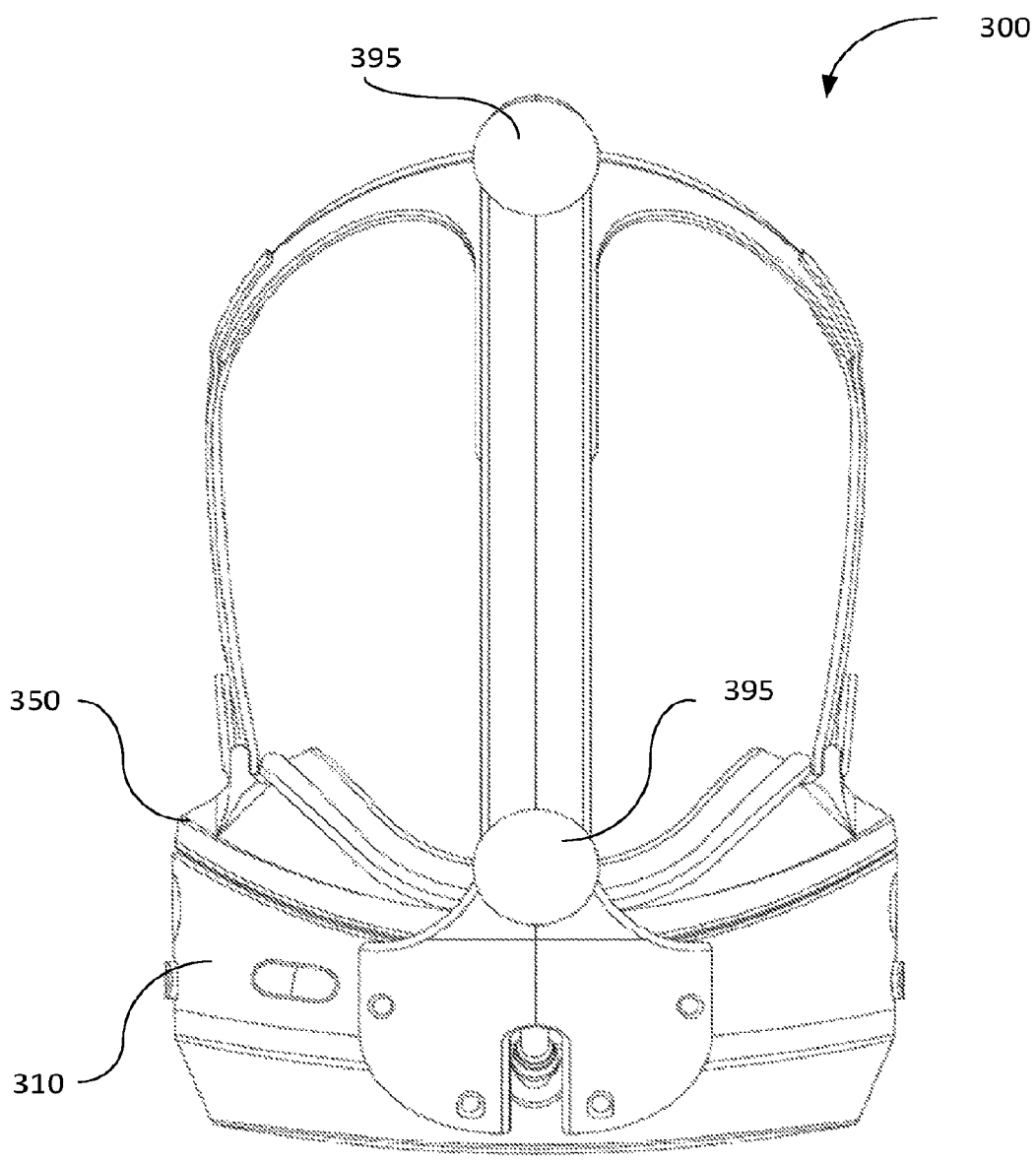
FIG. 15 is a top view of the head-mounted display of FIG. 12.

Some embodiments described herein relate to head-mounted displays having an optical assembly and a support structure. The optical assembly can include the display, lenses, sensors, electronics and similar components. In this way, fragile and/or expensive components can be concentrated in the optical assembly. The support structure can include a faceplate and straps configured to hold the head-mounted display to the user's head. The optical assembly can be removably coupled to the support structure. Support structures can be interchangeable with optical assemblies such that one support structure can be configured to be removably coupled to all, most, or several optical assemblies. For example, support structures can be made in different sizes (e.g., small, medium, large, children's, etc.). A small support structure can have an interior side configured to fit a smaller head, while a large support structure can have an interior side configured to fit a larger head. In addition or alternatively, different support structures can have configurations for different facial structures. For example, a support structure designed for an average person of European descent may not properly fit a person of African or East Asian descent, which may result in discomfort and/or light leakage between the face and the cushion. Accordingly, a variety of support structure can be produced for various permutations of facial structures (e.g., more and less pronounced cheekbones, different sized nasal ridges, more and less pronounced supraorbital ridges, etc.) in addition or as an alternative to different sized support structures. In some embodiments various support structures (e.g., both the small support structure and the large support structure) can have an exterior side with the same dimensions such that one optical assembly can be coupled to multiple, many, most, and/or all support structures.

In a public-use scenario, the attraction operator may maintain a greater number of relatively inexpensive support structures than relatively expensive optical assemblies. For example, guests waiting in line to experience an attraction can be provided with support structures without optical assemblies. As a guest prepares to enter the attraction (e.g., an amusement park ride, a simulator, an immersive video game experience, etc.) the guest can fit the support structure to his or her head, for example, selecting a support structure of the appropriate size, adjusting straps, etc. Then, as the guest enters the attraction, the operator can provide the optical assembly. For example, the guest and/or operator can couple the optical assembly to the support structure, and/or the optical assembly can be coupled to or integrated into infrastructure of the attraction, such as a harness, chair, simulator cockpit, etc. When the guest leaves the attraction, the optical assembly can be decoupled from the support structure and used by the next guest who has been provided a different support structure. In some such instances, the attraction provider may only require a number of optical assemblies equal to the capacity of the attraction without constraining throughput.

In addition, in some embodiments, the support structure can be devoid of electronics and/or lenses, waterproof, and/or otherwise robustly constructed. The support structure can be submerged in water, roughly handled without breaking, and/or machine washable. Thus, guests of the attraction can be entrusted with a relatively low-cost, relatively rugged component of a head-mounted display and only briefly be in possession of the relatively expensive and fragile optical components. In addition, the optical assembly can be supported by a chair or restraint which can reduce or eliminate the possibility of droppage and/or theft. After the guest has returned the support structure, the attraction owner can subject the support structure to vigorous cleaning before supplying the used support structure to another guest. For example, the support structure can be submerged in liquid, subjected to machine washing, and/or dried under heat, which is not possible with known head-mounted displays.

Furthermore, in some instances, guests can bring their personal support structures and/or the attraction operator may provide and/or sell support structures. Thus guests can have personal support structures that have personalized fit and/or graphics in addition to the peace of mind that their support structures were not previously used by another person and without requiring guests to make the capital investment of purchasing the relatively expensive optical assembly.

FIG. 1 is a schematic diagram of a head-mounted display 100, according to an embodiment. The head-mounted display 100 includes an optical assembly 110 and a support structure 150. The optical assembly 110 can be removably coupled to the support structure 150 via a coupling mechanism 140. For example, a quick release latch, a buckle, snaps, hook-and-loop fasteners, and/or any other suitable coupling mechanism can join the optical assembly 110 to the support structure 150.

In some embodiments, the optical assembly 110 can include all components necessary to generate an image and project the image to a user's eyes. For example, the optical assembly 110 can include one or more displays 120, which can be, for example, a light emitting diode display and one or more lenses and/or lens sets 125 (e.g., a lens set for each eye). The optical assembly 110 can also include a printed circuit board 130, any number of processors, an input port (e.g., an HDMI port), any number of sensors (e.g., accelerometers, gyroscopes, etc.), a battery, an eye-tracking camera, a front-facing and/or depth camera (e.g., behind a transparent and/or semi-transparent window), and/or any other suitable electronics.

The support structure 150 can be configured to be placed into contact with the user's head and secured with a strap 170. The optical assembly 110 can be coupled to the support structure 150 such that the optical assembly 110 does not directly contact any portion of the user's body. The support structure 150 can include a cushion 160, which can be, for example, a foam pad, configured to be pressed against the user's face. The cushion 160 can be configured to deform when the support structure 150 is worn and/or can be configured to minimize or eliminate light leaks.

In some embodiments, the support structure 150 can be devoid of electronics and/or optical components, although it should be understood that in other embodiments, the support structure 150 can include one or more optical or electronic components. The support structure 150 can also be constructed of ruggedized materials, such as resilient plastics, foamed rubber, and so forth. In some embodiments, the support structure 150 can be waterproof and/or can withstand immersion in water, application of detergents, and/or other cleaning procedures.

FIGS. 2-11 are various views of a head-mounted display 200, according to an embodiment. The head-mounted display 200 includes an optical assembly 210 and a support structure 250. The optical assembly 210 and the support structure 250 can be similar to the optical assembly 110 and the support structure 150 described above with reference to FIG. 1

The optical assembly 210 has a concave inner surface 235 configured to matingly engage a convex outer surface 245 of the support structure 250. When the optical assembly 210 is in contact with the support structure 250, one or more spring loaded latches 240 (or other suitable coupling device) can matingly engage to secure the optical assembly 210 to the support structure 250. When the optical assembly 210 is coupled to the support structure 250, light leaks between the optical assembly 210 and the support structure 250 can be minimized or eliminated. The optical assembly 210 can be detached from the support structure by depressing one or more buttons 242 located on the side (or any other portion) of the optical assembly 210, which can cause the spring loaded latches 240 to release. In other embodiments, the buttons 242 can be located on the support structure 250.

As described above, the support structure 250 has a convex outer surface 245 configured to matingly engage a concave inner surface 235 of the optical assembly 210. In some embodiments, the support structure 250 can be constructed in various sizes (e.g., small, medium, large, etc.) by altering the geometry of portions of the support structure 250. In such embodiments, the geometry of the convex outer surface 245 may be held constant while other portions of the support structure 250 geometry, such as the cushion 260 are varied. In this way, support structures 250 of different sized can be interchangeable in mating with optics assemblies 210.

In some embodiments, optical assemblies can be manufactured with consistent dimensions, such that any optical assembly can be matingly coupled to multiple support structures. In other embodiments, the geometry of the concave inner surface 235 of the optical assembly 210 can be held constant while other geometries and/or components of optical assemblies are varied. In this way optical assemblies with different capabilities, upgrades, new models, etc. can be compatible with existing support structures.

The optical assembly 210 also includes vents 220 which can increase airflow to the interior of the head-mounted display 200. When the support structure 250 is in contact with the user's face and the optical assembly 210 is attached, heat and humidity can build within the head-mounted display 200. The vents 220, optionally in conjunction with fans, can move hot, humid air out of the head-mounted display and/or move cooler ambient air into the head-mounted display 200. Such vents can reduce fogging and improve comfort for the wearer. In some embodiments, the optical assembly 210 can include interior vents 222, for example, on the concave inner surface 235, such that airflow can cool electronic components and the interior volume between the user's face and the optical assembly 210. The support structure 250 can also include vents 244 which can align with the interior vents 222 of the optical assembly 210 and/or otherwise provide a flow path to an interior of the support structure 250.

Although not shown in FIGS. 2-11, in some embodiments, the support structure 250 and the optical assembly 210 can include complementary electrical contacts that are electrically coupled when the support structure 250 is coupled to the optical assembly 210. In some such embodiments, a battery or other power source can be coupled to the support structure 250 and the optical assembly 210 can be powered via the power source and the complementary electrical contacts. In some such embodiments, the power source can be removably coupled to the support structure 250, and the power source can be removed from the support structure 250 for cleaning of the support structure 250. Similarly, in some embodiments, speakers, microphones and/or other suitable peripheral devices can be coupled (e.g., removably coupled) to the support structure 250. Electrical contacts between the optical assembly 210 and the support structure 250 can allow communication and/or power to be transmitted between the optical assembly 210 and the support structure 250 and/or attached peripheral devices.

The optical assembly 210 includes an adjustment mechanism 224 which can be operable to adjust the interpupillary distance of lenses and/or lens sets within the optical assembly. The optical assembly 210 can include any other suitable adjustment mechanisms to adjust, for example, focus, zoom, and/or so forth.

The support structure 250 includes a cushion 260, which can be constructed of compliant foam rubber and/or any other suitable material. Straps 270 are coupled to the support structure 250 can be used to hold the support structure 250 to the head of the user. When the support structure 250 is worn on the user's head, the cushion 260 can conform to the user's face, reducing or eliminating light leaks from around the cushion 260 and providing a comfortable fit.

The support structure 250 can include an open and/or transparent front 255 such that when the support structure 250 is worn, the user can see through the support structure 250 and into the optical assembly 210 when the optical assembly is coupled to the support structure. When the optical assembly 210 is not coupled to the support structure 250, the support structure 250 does not obstruct the macular or near-peripheral vision of the wearer. In some embodiments, the support structure 250 does not obstruct the mid-peripheral and/or far-peripheral vision of the wearer. In this way, a user wearing the support structure 250 does not have his or her vision obstructed. Thus, the user can fit the support structure 250 in advance of participating in an attraction and continue to wear the support structure 250 while the user walks to takes his position within the attraction and has the optical assembly 210 coupled to the support structure 250.

As shown, the straps 270 include a clip 275 configured to retain a cable 225 coupled to the optical assembly 210. In other embodiments the head-mounted display 200 can include any suitable cable management device, such as a sleeve, zip-ties, twist ties, etc. The cable 225 can be coupled to the optical assembly 210 and the computing entity and/or video source by any suitable means, such as being hard-wired, via HDMI connections, via USB connections, via display port connections, etc. The cable 225 can be operable to carry any suitable signal to and/or from the optical assembly 210. For example, the cable 225 can carry video signals and/or audio signals from a computing entity and/or or video source to the optical assembly 210. In addition or alternatively, the cable 225 can be operable to convey data from sensors within the optical assembly 210 (e.g., accelerometers, level sensors, etc.) to a computing entity. In use, the optical assembly 210 can be coupled to the support structure 250, and then the cable 225 can be routed over the user's head and secured in place within the clip 275, which can prevent the cable 225 does not interfere with the user's movements. In some instances, the cable 225 can be routed into or through a chair or restraint behind the user. In other embodiments, the head-mounted display 200 can be wireless and configured to send and/or receive signals via any suitable wireless protocol and/or can contain the media and/or processing capabilities to project an image without receiving a signal from an external device. For example, the head-mounted display 200 can be a stand-alone computing entity including memory (e.g., flash memory and/or hard disk drive), a central processing unit, a graphical processing unit, and/or any other suitable computing components necessary to store, execute, render, and/or display an augmented- and/or virtual-reality environment.

In some embodiments, the head-mounted display 200 can be configured to have any suitable peripheral device attached. For example, the optical assembly 200 includes audio attachment points 246, each of which can be configured to have a speaker and/or microphone attached thereto. The audio attachment points 246 can be provide physical and/or electrical connections between the head-mounted display 200 and peripheral devices. For example, the attachment points 246 can be magnetic electrical contacts or any other suitable attachment structure.

FIGS. 12-15 depict a head-mounted display 300 with a peripheral device—position tracking horn 390. The head-mounted display 300 includes an optical assembly 310, a support structure 350. The position tracking horn 390 includes two markers 395 (e.g., retro-reflective markers) adapted to be captured by an exterior position-tracking camera (not shown). In this way, the position and orientation of the user's head can be determined and, in some instances, the display presented to the user via the optical assembly 310 can be altered such that the user can "look around" a virtual and/or augmented reality space.

The position tracking horn 300 and/or any other suitable peripheral device (e.g., headphones, microphones, cameras, etc.) can be fixedly and/or removably coupled to optical assembly 310.

Figure 16:
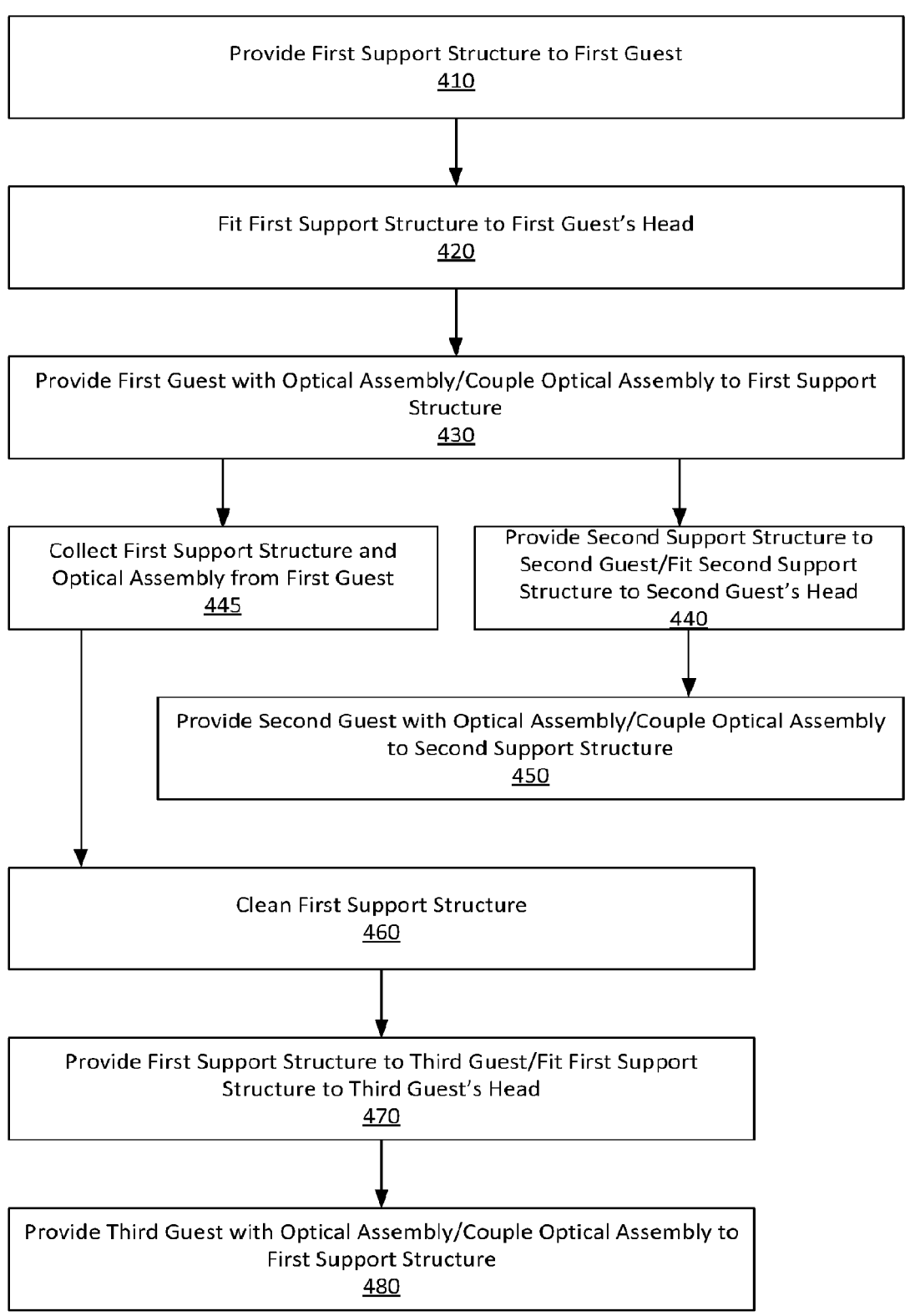
FIG. 16 is a flow chart of a method for using head-mounted displays for public use, according to an embodiment.

FIG. 16 is a flow chart of a method of using head-mounted displays for public use, according to an embodiment. The head-mounted displays can be structurally and/or functionally similar to those described above. For example, the head-mounted displays can include a support structure and an optical assembly. The head-mounted displays can be used in a multi-user environment or attraction, such as an amusement park, movie theatre or the like. The optical assemblies and/or the support structures can be owned and/or controlled by an operator of the attraction. In some instances, the operator may possess fewer relatively cheaper support structures than relatively expensive optical assemblies.

At 410, a first support structure can be provided to a first guest. The support structure can be fit to the first guest's head, at 420. For example, an appropriately sized and/or shaped support structure can be selected for the first guest, placed on the first guest's head, and/or straps or other suitable adjustment mechanism can be altered to provide a suitably snug fit to the first guest's face and/or head. In some instances providing the first support structure, at 410, and/or fitting the first support structure to the first guest's head, at 420, can be performed while the first guest is waiting in line. Similarly stated, the first support structure can be fitted to the first user before an optical assembly is provided to the first guest. In addition, in some instances, the first support structure may not substantially impair the vision of the first guest, and the first guest can safely walk or be directed to walk into an attraction while wearing the first support structure. At 430, the first guest can be provided with an optical assembly and/or the optical assembly can be coupled to the first support structure. For example, the optical assembly can be provided to the first user upon entering or shortly before entering the attraction. In some instances, when coupled to the first support structure, the optical assembly can be suspended from the first support structure such that no portion of the optical assembly is in contact with the first guest's head and/or face.

At 440, a second support structure can be provided to a second guest and/or the second support structure can be fitted to a second guest's head. In some instances, the second support structure can be provided to the second guest and/or fitted to the second guest's head while the first guest is using/in possession of the optical assembly. For example, the second guest can be provided the second optical assembly while waiting in line and while the first guest is using the optical assembly in the attraction.

At 445, the first support structure and/or the optical assembly can be collected from the first guest, for example, after the first guest has experienced and is exiting or is in the process of exiting the attraction. The optical assembly can be provided to the second guest and/or coupled to the second support structure, at 450. Similarly stated, the optical assembly can be used by the first guest and the second guest even though the first guest and the second guest are provided with different support structures. Again, in some instances, the optical assembly can be suspended from the second support structure such that no portion of the optical assembly is in contact with the second guest's face and/or head. Thus, the optical assembly can be passed from guest to guest without the need for cleaning and/or intensive cleaning.

At 460, the first support structure can be cleaned. For example, as discussed above, the first support structure may be devoid of electronics and/or optics, and can be submersed in liquid, machine washed, placed in a dish washer, or otherwise subjected to intensive cleaning. In instances in which the attraction provider maintains a larger number of support structures than optical assemblies, cleaning the support structure, at 460, may not impact guest throughput. Similarly stated, while some support structures are being cleaned and are temporarily out of service, "excess" support structures can be provided and/or used by guests experiencing the attraction and/or waiting in line for the attraction.

After cleaning, at 460, the first support structure can be returned to service and provided to a third guest and/or fitted to the third guest's head, at 470. Then, at 480, the third guest can be provided with the optical assembly and/or the optical assembly can be coupled to the first support structure, at 480.

Although FIG. 16 has been discussed with reference to support structures provided by the attraction operator, it should be understood that in some instances, guests may be able to bring personal support structures operable to be coupled to the optical assembly. In addition, although FIG. 16 has been discussed in terms of a first support structure, a second support structure, and an optical assembly, it should be understood that an attraction provider may use any number of optical assemblies and support structures. In some embodiments, each support structure can be configured to be coupled to each optical assembly.

While various embodiments have been described above, it should be understood that they have been presented by way of example only, and not limitation. For example, although some embodiments describe an optical assembly having a concave internal surface and a support structure having a convex outer surface, in other embodiments, the inner surface of the optical assembly can be convex while the outer surface of the support structure can be concave. It should be understood that any other suitable geometries are possible. For example, the optical assembly and the support structure can include mating keys and keyways, sliding fits, etc. Although various embodiments have been described as having particular features and/or combinations of components, other embodiments are possible having a combination of any features and/or components from any of embodiments where appropriate.

Where methods and/or schematics described above indicate certain events and/or flow patterns occurring in certain order, the ordering of certain events and/or flow patterns may be modified. Additionally certain events may be performed concurrently in parallel processes when possible, as well as performed sequentially. While the embodiments have been particularly shown and described, it will be understood that various changes in form and details may be made.

What is claimed is:

1. An apparatus, comprising:

a support structure devoid of electronics and/or optics, the support structure comprising a first latching surface having a first latching structure of a latching mechanism disposed therein; and an optical assembly comprising a plurality of lenses configured to project an image from a display, wherein the optical assembly further comprises a second latching surface having a second latching structure of the latching mechanism, wherein the optical assembly is configured to be matingly and removably coupled to the support structure via the latching mechanism with the second latching surface of the optical assembly and the first latching surface of the support structure matingly engaged to each other, in a manner that leakage from the image projected by the plurality of lenses is minimized, wherein the first latching surface of the support structure comprises a convex surface; and the second latching surface of the optical assembly comprises a concave surface, the optical assembly configured to be matingly and removably coupled to the support structure via the latching mechanism with the concave surface of the optical assembly and the convex surface of the support structure matingly engaged to each other, wherein the concave surface of the optical assembly comprises a first plurality of vents and the convex surface of the support structure comprises a second plurality of vents, and when the optical assembly is coupled to the support structure, the first plurality of vents of the concave surface of the optical assembly are at least partially in alignment with the second plurality of vents of the convex surface of the support structure, whereby a flow path is formed between the first plurality of vents and the second plurality of vents.

2. The apparatus of claim 1, wherein the apparatus comprises a head-mounted display when the optical assembly is coupled to the support structure; and wherein the support structure comprises a deformable headrest component, and the optical assembly is configured to be kept away from a head of a user by the support structure, when the head-mounted display is worn on the head of the user.

3. The apparatus of claim 1, wherein the concave surface of the optical assembly is facing in a projection direction of the image from the display with respect to the plurality of lenses and the convex surface of the support structure is facing forward with respect to eyes of the user when the support structure is worn by the user such that the image from the display is projected onto the eyes of the user when the optical assembly is coupled to the support structure, and the first plurality of vents of the concave surface of the optical assembly are at least partially in alignment with the second plurality of vents of the convex surface of the support structure along the projection direction.

4. The apparatus of claim 1, wherein:
the optical assembly includes a fan, the fan configured to move air between an interior of the optical assembly and an exterior of the optical assembly between the first plurality of vents and the second plurality of vents.

5. The apparatus of claim 1, further comprising:
an adjustment mechanism, operable to adjust an interpupillary distance of the plurality of lenses within the optical assembly.

6. The apparatus of claim 1, wherein:
the convex surface of the support structure is covered by the optical assembly when the optical assembly is coupled to the support structure; and
the concave surface of the optical assembly covers the convex surface of the support structure when the optical assembly is coupled to the support structure.

7. The apparatus of claim 1, further comprising a peripheral device for tracking positions.

8. The apparatus of claim 7, wherein the peripheral device for tracking positions comprises two retro-reflective markers adapted to be captured by an exterior position-tracking camera.

9. The apparatus of claim 8, wherein the peripheral device for tracking positions comprises a position tracking horn and the two retro-reflective markers are spaced apart from each other with one disposed at one end of the position tracking horn and the other disposed at the other end of the position tracking horn.

10. The apparatus of claim 1, wherein the second latching structure of the latching mechanism comprises one or more spring loaded latches configured to secure the optical assembly to the support structure.

11. The apparatus of claim 1, wherein the first latching structure of the latching mechanism disposed in the support structure and comprises one or more buttons configured to be depressed to detach the support structure from the optical assembly.

12. The apparatus of claim 11,
wherein the support structure is a first support structure having a first size or a second support structure having a second size different from the first size,
wherein the optical assembly is configured to interchangeably coupled to the first support structure and the second support structure.

13. The apparatus of claim 12, wherein the first support structure has a first interior side and a first exterior side, and the second support structure has a second interior side and a second exterior side; and wherein the first interior side has dimensions different from the second interior side and the first exterior side has the same dimensions as the second exterior side.

14. The apparatus of claim 12,
wherein the first support structure comprises a first convex surface and the second support structure comprises a second convex surface, the first convex surface having a same geometry as the second convex surface; and
wherein the first support structure has a first cushion configured to contact a face of a user and the second support structure has a second cushion, the first cushion being different in sizes from the second cushion.

15. The apparatus of claim 1, wherein the support structure comprises an open and/or transparent front such that when the support structure is worn by a user, the image is free of blockage of the support structure and projected into eyes of the user.

16. The apparatus of claim 1, wherein the display comprises a light emitting diode display.

17. The apparatus of claim 1, wherein the support structure comprises a strap and wherein the strap comprises a clip configured to retain a cable coupled to the optical assembly.

18. The apparatus of claim 1, wherein the optical assembly comprises one or more audio attachment points, each of which is configured to have a speaker and/or microphone attached thereto.

\* \* \* \* \*